(12) United States Patent
Koh

(10) Patent No.: US 6,887,766 B2
(45) Date of Patent: May 3, 2005

(54) SEMICONDUCTOR DEVICE AND METHOD OF FABRICATING THE SAME

(75) Inventor: Kwan-Ju Koh, Bucheon (KR)

(73) Assignee: ANAM Semiconductor Inc., Seoul (KR)

( * ) Notice: Subject to any disclaimer, the term of this patent is extended or adjusted under 35 U.S.C. 154(b) by 0 days.

(21) Appl. No.: 10/721,659

(22) Filed: Nov. 25, 2003

(65) Prior Publication Data

US 2004/0169282 A1 Sep. 2, 2004

(30) Foreign Application Priority Data

Dec. 5, 2002 (KR) .................................. 10-2002-0076826

(51) Int. Cl.⁷ ............................................... H01L 21/76
(52) U.S. Cl. ........................ 438/421; 438/422; 438/619
(58) Field of Search .............................. 438/421–422, 438/619, 622, 624, 626; 257/522

(56) References Cited

U.S. PATENT DOCUMENTS

| | | | |
|---|---|---|---|
| 4,735,681 A | * | 4/1988 | Alvarez ....................... 438/702 |
| 5,698,467 A | * | 12/1997 | Sakao et al. ................. 438/692 |
| 6,093,633 A | * | 7/2000 | Matsumoto .................. 438/622 |
| 6,239,016 B1 | * | 5/2001 | Ishikawa ..................... 438/619 |
| 6,268,276 B1 | | 7/2001 | Chan et al. |
| 6,358,845 B1 | | 3/2002 | Lou |
| 6,376,330 B1 | | 4/2002 | Fulford, Jr. et al. |
| 6,403,461 B1 | | 6/2002 | Tae et al. |
| 6,423,630 B1 | | 7/2002 | Catabay et al. |
| 6,472,719 B1 | | 10/2002 | Lin et al. |

* cited by examiner

*Primary Examiner*—Phat X. Cao
*Assistant Examiner*—Theresa T. Doan
(74) *Attorney, Agent, or Firm*—Hanley, Flight & Zimmerman, LLC

(57) ABSTRACT

A semiconductor device having an interlayer insulation film with a low capacitance and a method of fabricating the same are disclosed. An example semiconductor device having a multi-layered metal wire structure includes first and second interlayer insulation films provided between lower metal wire layers and upper metal wire layers. The example semiconductor device also includes air gaps formed in the first interlayer insulation film at an interlevel between the upper and lower metal wire layers and via holes connecting the upper and lower metal wire layers.

8 Claims, 6 Drawing Sheets

SEMICONDUCTOR DEVICE AND METHOD OF FABRICATING THE SAME

FIELD OF THE DISCLOSURE

The present disclosure relates generally to a semiconductor device having a multi-layered metal wire structure and, more particularly, to a semiconductor device having an interlayer insulation film with a low capacitance and a method of fabricating the same.

BACKGROUND

With the trend toward more highly integrated, multi-layer semiconductor devices, the use of multi-layered wiring techniques has been proposed as one of the important techniques for implementing such highly integrated, multi-layer semiconductor devices. Multi-layer wiring techniques typically use metal wire layers and insulation layers that are alternately formed on a top surface of a semiconductor substrate on which circuit devices are formed. In addition, such multi-layer wiring techniques utilize a circuit operation that is performed by electrically connecting the metal wire layers, which are separated by the insulation layers, through via holes.

However, in such a multi-layered metal wire structure the space between the metal wires narrows as the level of integration of the semiconductor device increases. As a result, the effects of parasite resistance or parasite capacitance between adjacent metal wires in the same layer or between lower and upper metal wire layers becomes more significant.

As is known, parasitic resistance or capacitance deteriorates an electrical characteristic due to a delay induced by an RC (resistance and capacitance), disturbs or limits the high speed operation of the semiconductor device, and typically increases power consumption and signal leakage of the semiconductor device.

Accordingly, to reduce the parasitic capacitance, studies for materials having a low dielectric constant K, for example, a SiC family among oxide materials of an existing TEOS (tetra ethyl ortho silicate) family has been progressed actively. However, in the case that new materials with such a low dielectric constant are used, additional equipment must be used and a process parameter optimization of each unit process for the new materials, thereby increasing processing costs.

Accordingly, methods of reducing the parasitic capacitance while using the oxide materials of the existing TEOS family as they are have been studied. As a result, there have been proposed methods where air gaps are formed in an interlayer insulation film between adjacent metal wires in order to reduce an overall capacitance, the so called "air gap formation method at intralevel." Techniques related to this are disclosed in U.S. Pat. Nos. 6,472,719, 6,423,630, 6,403, 461, 6,376,330, 6,358,845, and 6,268,276.

FIG. 1 is a sectional view of a multi-layered metal wire structure where air gaps are formed at an intralevel using a known technique. As shown in FIG. 1, lower metal wire layers 102 are formed on a structure of a semiconductor substrate, upper metal wire layers 106 are formed above the lower metal wire layers 102 via an interlayer insulation film 104, and the upper and lower metal wire layers 106 and 102 are electrically connected to each other through via holes 108. In addition, air gaps 110 are formed in the interlayer insulation film 104 between the lower metal wire layers 102.

However, conventionally, as shown in FIG. 1, the air gaps 110 are formed in only intralevels between the lower metal wire layers 102. That is, because it is impossible to form the air gaps between the lower metal wire layers 102 and the upper metal wire layers 106, there is a limit on the reduction of an overall capacitance.

Accordingly, if air gaps can be formed between the lower metal wire layers 102 and the upper metal wire layers 106, the overall capacitance can be significantly reduced. As a result, there is a strong need for the formation of air gaps at such an interlevel.

DETAILED DESCRIPTION

As described in greater detail below, an example semiconductor device having a multi-layered metal wire structure includes first and second interlayer insulation films provided between lower metal wire layers and upper metal wire layers. In addition, air gaps may be formed in the first interlayer insulation film at an interlevel between the upper and lower metal wire layers and via holes may connect the upper and lower metal wire layers.

Still further, an example method of fabricating a semiconductor device described in greater detail below may form a first interlayer insulation film above a lower insulation film on a top surface of a semiconductor substrate where an individual element including lower metal wire layers is formed. The example method may form a first mask film and a second mask film on the first interlayer insulation film sequentially and may form a first etch mask to be used to form air gaps by selectively etching the second mask film. Still further, the example method may deposit a third mask film on the first etch mask and the first mask film and may form a second etch mask by etching the third mask film and exposed the first mask film. The second etch mask may be made from the third mask film remaining on side walls of the first etch mask and the first mask film remaining below the first etch mask and the third mask film. Still further, the example method may remove the first etch mask and substantially simultaneously form open pores in the first interlayer insulation film by etching the first etch mask and exposed the first interlayer insulator film using the second etch mask. The example method may also form air gaps consisting of closed pores in the first interlayer film at an interlevel between upper metal wire layers and the lower metal wire layers by forming a second interlayer insulation film after removing the second etch mask and may form via holes to expose the lower metal wire layers by selectively removing the first and second interlayer insulation films, filling metal material in the via holes, and then forming the upper metal wire layers.

Figure 1:
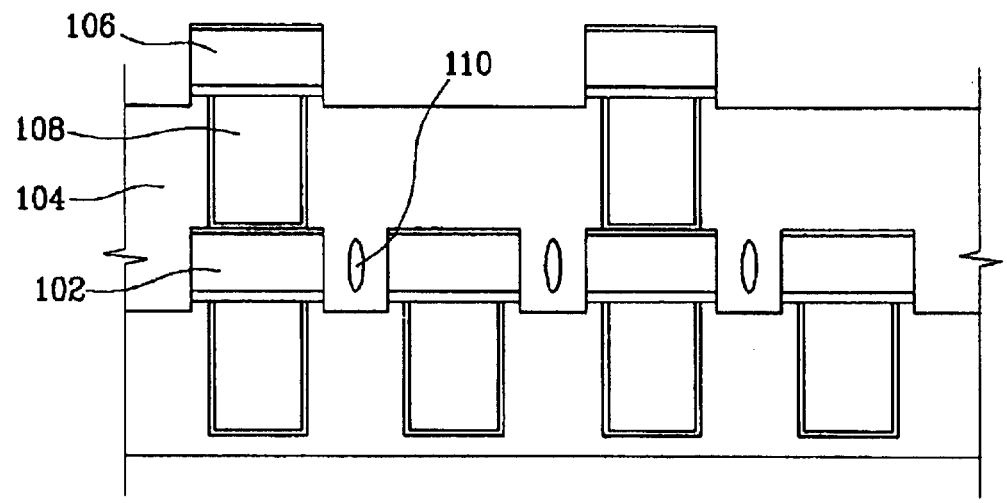
FIG. 1 is a sectional view of a multi-layered metal wire structure where air gaps are formed at an intralevel using a known method.
Figure 2:
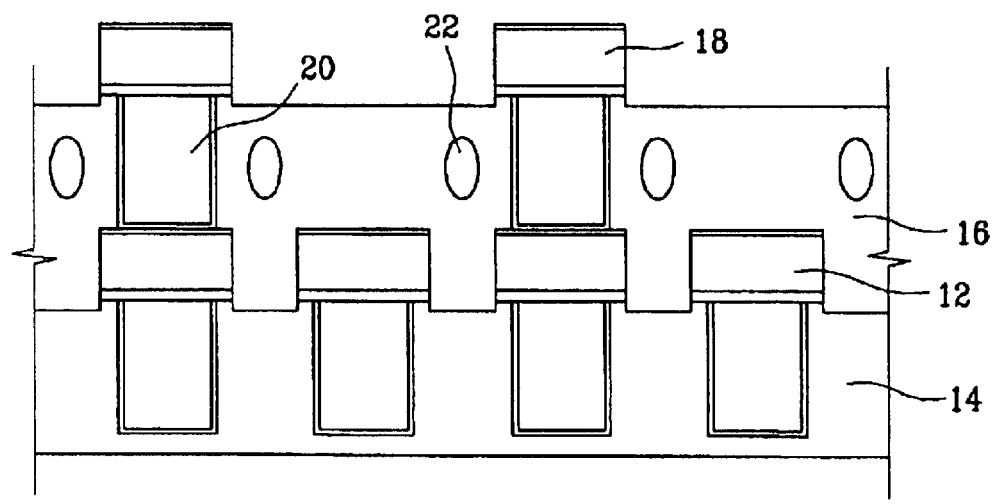
FIG. 2 is a sectional view of an example multi-layered metal wire structure in which air gaps are formed at an interlevel.

FIG. 2 is a sectional view of an example multi-layered metal wire structure where air gaps are formed at an interlevel. FIGS. 3a to 3i are views showing an example process of forming the air gaps of FIG. 2. As shown in the figures, an interlayer insulation film 16 consisting of first and second interlayer insulation films is formed above a lower insulation film 14 on a top surface of a semiconductor substrate where an individual element including lower metal wire layers 12 is formed. In addition, via holes 20 for connecting upper metal wire layers 18 and the lower metal wire layers 12 are formed in the interlayer insulation film 16.

In the example semiconductor device shown in FIG. 2, air gaps 22 are formed in the interlayer insulation film 16 at an interlevel between the upper and lower metal wire layers 18 and 12. This allows the reduction of an overall capacitance over the conventional semiconductor devices where air gaps are formed in the interlayer insulation film at the intralevel between the lower metal wire layers.

Figure 3A:
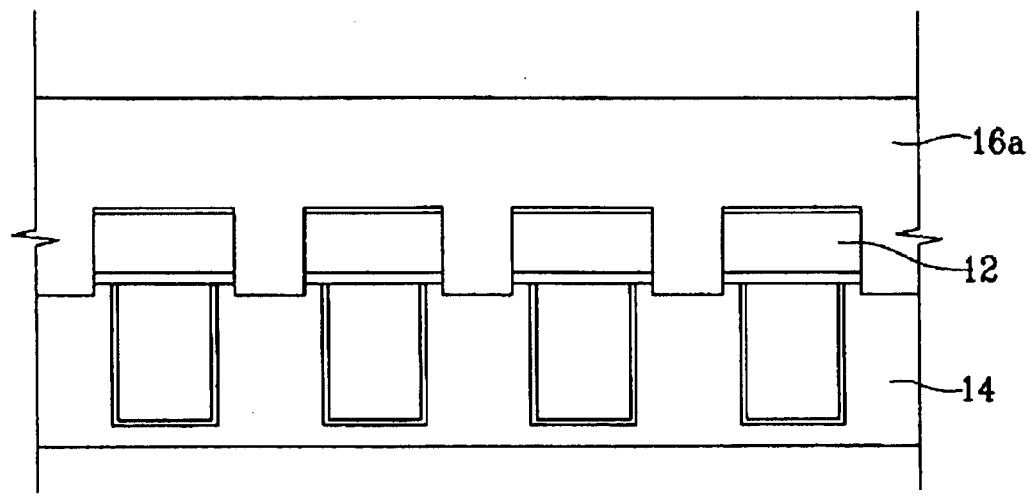
FIGS. 3A to 3I are views showing an example method of forming the air gaps of FIG. 2.

Now turning to the example method of FIG. 3, FIG. 3A illustrates that the first interlayer insulation film 16a is formed above the lower insulation film 14 on a top surface of a semiconductor substrate where an individual element including lower metal wire layers 12 is formed. An oxide film which is formed by a deposition of materials of commonly used TEOS family can be used as used in the first interlayer insulation film 16.

Figure 3B:
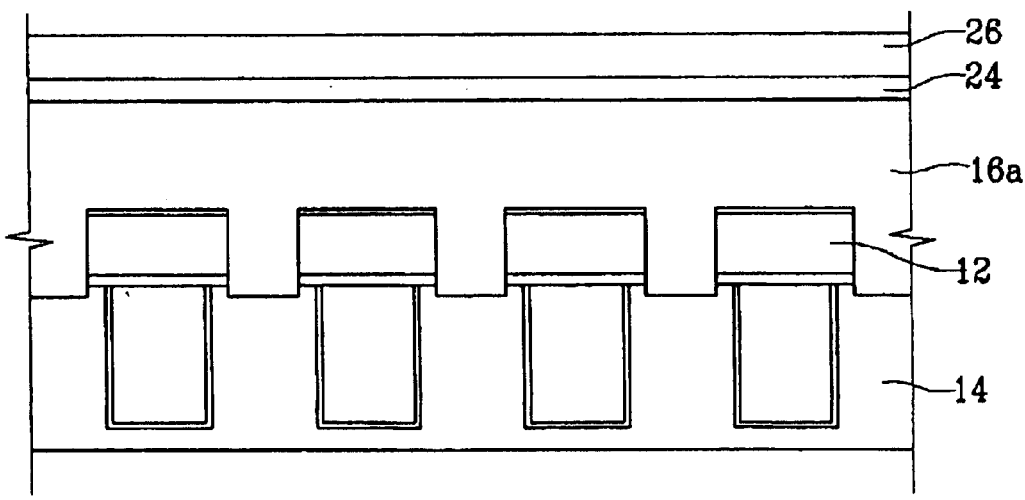
Figure 3C:
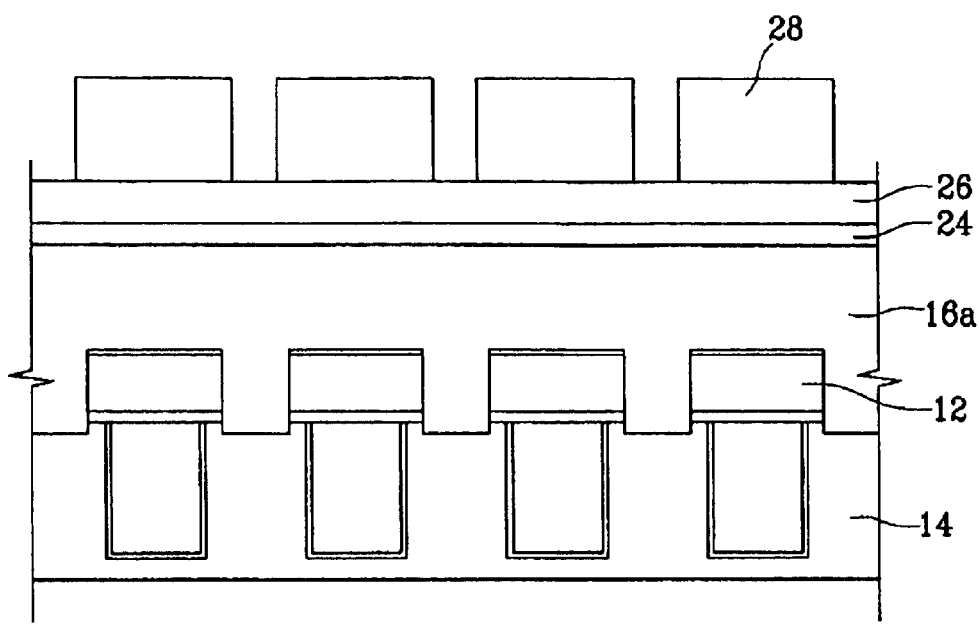

Subsequently, as shown in FIG. 3B, a nitride film 24 and an oxide film 26 are formed on the first interlayer insulation film 16a sequentially, and then, as shown in FIG. 3C, by applying, exposing and developing a photosensitive film on the oxide film 26, a pattern of mask 28 for exposing a portion of the oxide film 26 corresponding to a position where air gaps are to be formed is formed. At this time, the position where air gaps are to be formed is preferably a top portion between the lower metal wire layers 12, not a top portion of the metal wire layers where via holes 20 are to be formed.

Figure 3D:
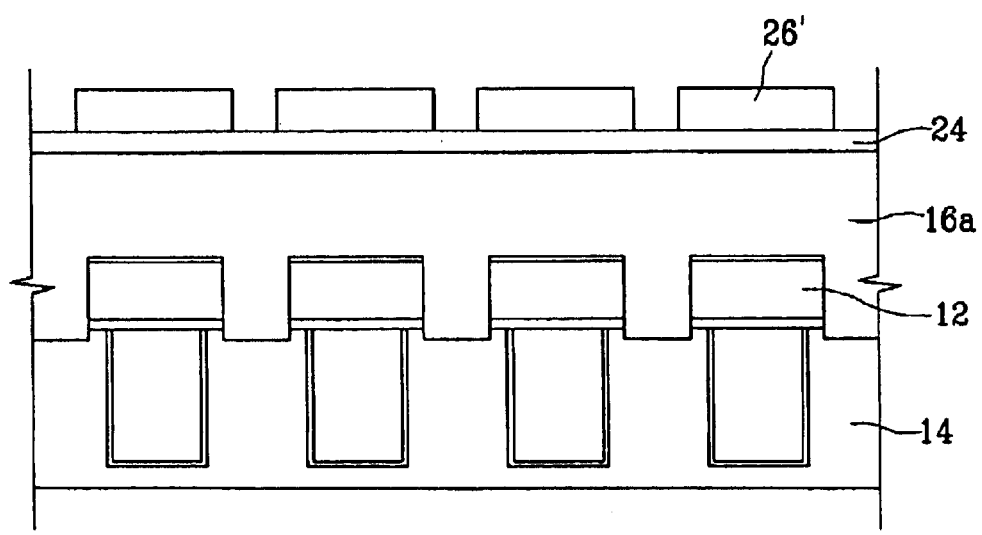

Next, as shown in FIG. 3D, after forming a pattern of oxide film 26' by etching the oxide film 26 exposed using the pattern of mask 28 as a mask, the pattern of mask 28 is removed, and then a cleaning process is performed.

Figure 3E:
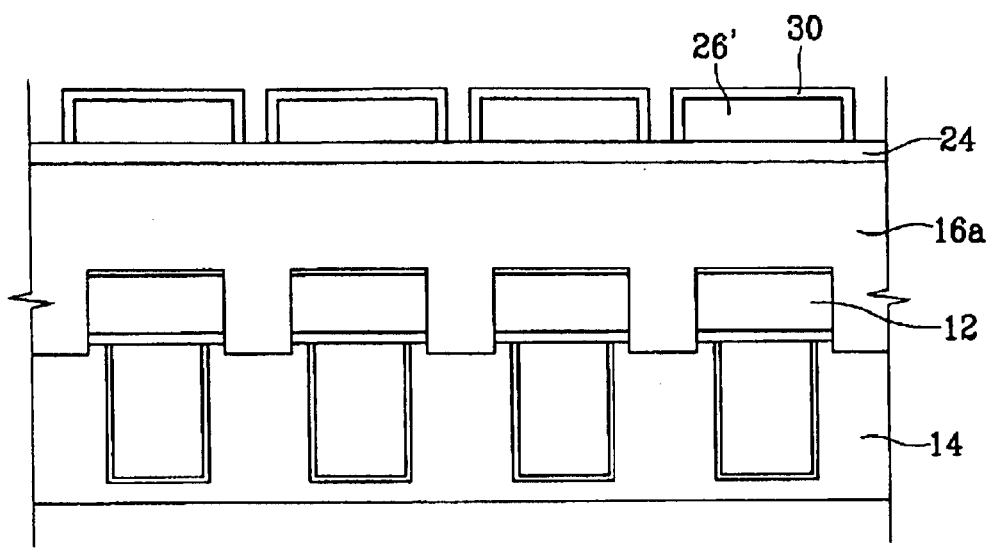
Figure 3F:
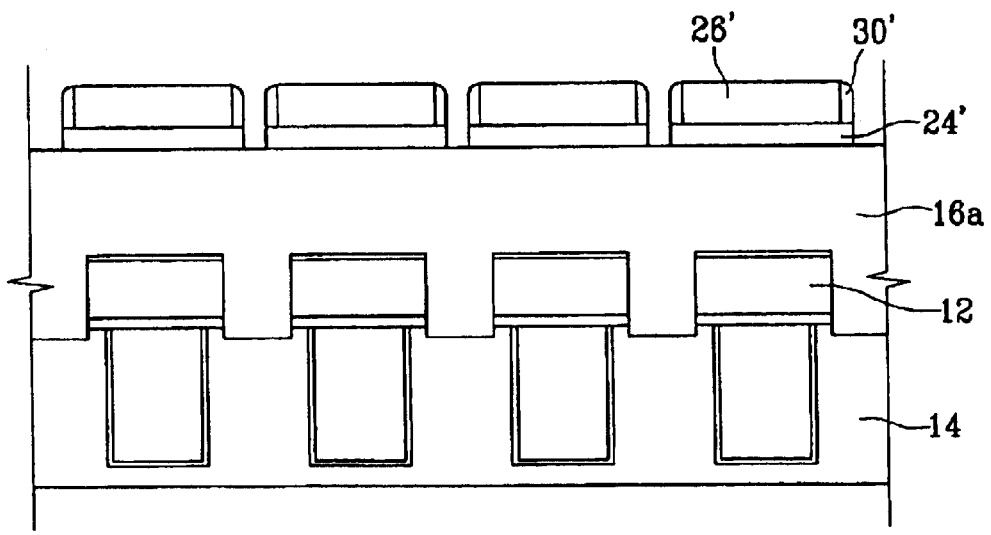

Next, as shown in FIG. 3E, a nitride film 30 is deposited on the pattern of oxide film 26', and then, as shown in FIG. 3F, by etching the nitride film 30 above the pattern of oxide film 26' and the nitride film 24 exposed below the pattern of oxide film 26', side walls 30' are formed in the pattern of oxide film 26', and simultaneously a pattern of nitride film 24' is formed.

Figure 3G:
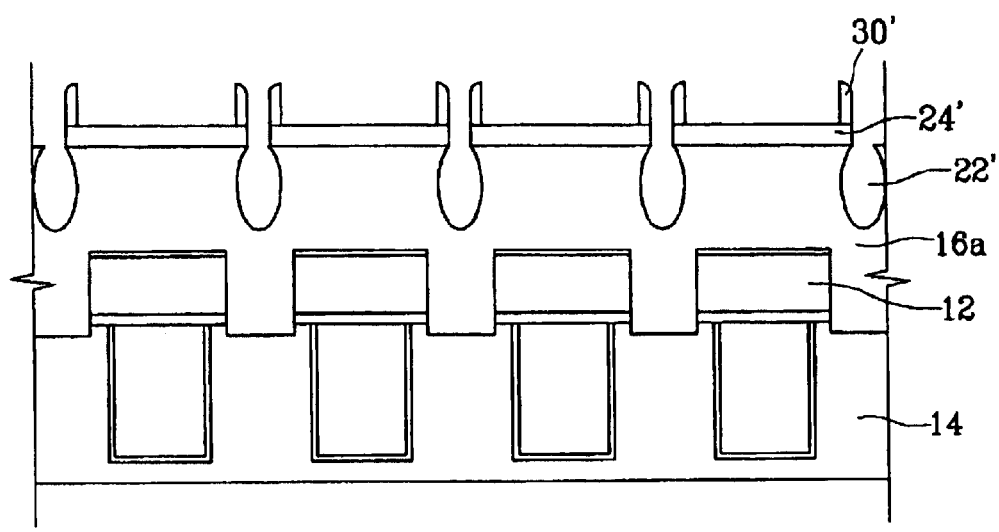

Continuously, as shown in FIG. 3G, the first interlayer insulation film 16a is etched by using a dry isotropic etching. By the dry isotropic etching, the first interlayer insulation film 16a is etched into a shape close to a circle, and accordingly, open pores 22' are formed in the first interlayer insulation film 16a. At this time, a specific shape, e.g., a size and an extent of opening, of the open pores 22' formed by the isotropic etching can be adjusted by using etching time, for example.

In addition, the pattern of oxide film 26' is also removed when the first interlayer insulation film 16a is etched.

Figure 3H:
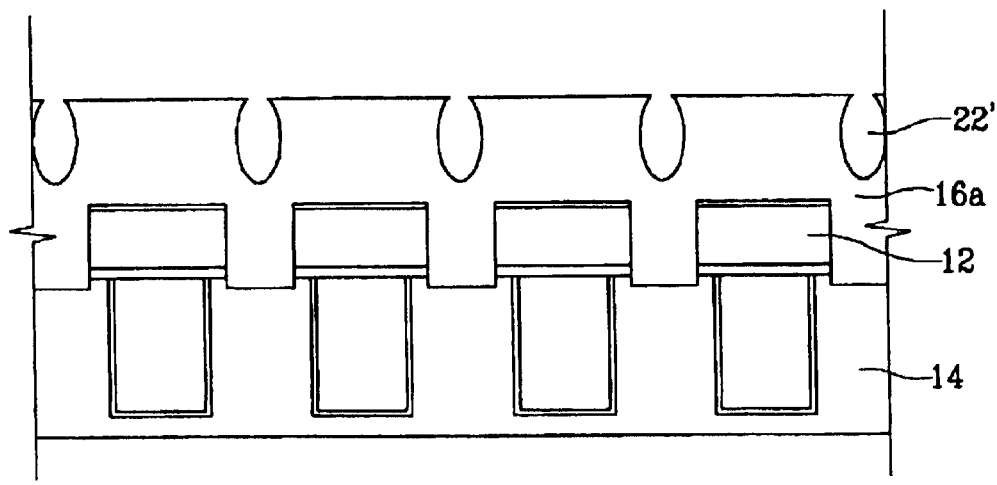
Figure 3I:
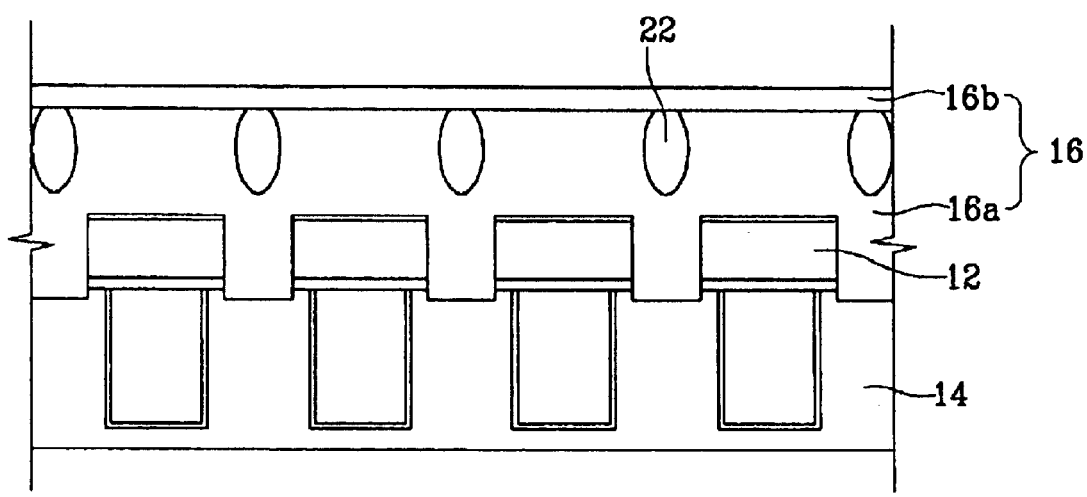

Next, as shown in FIG. 3H, the nitride film 24' and the side walls 30' remaining on the first interlayer insulation film 16a are removed, and then, as shown in FIG. 3I, after forming a second interlayer insulation film 16b by successively depositing a TEOS oxide film made from the same material as the first interlayer insulation film 16a on the first interlayer insulation film 16a, a top surface of the second interlayer insulation film 16b is planarized by means of a chemical and mechanical polishing process.

At this time, the second interlayer insulation film 16b is deposited on the first interlayer insulation film 16a such that openings of open pores 22' are blocked and, as a result, closed pores 22 are formed in the first interlayer insulation film 16a.

Accordingly, the closed pores 22 formed in the first interlayer insulation film 16a function as air gaps in terms of a dielectric constant of an insulator.

Finally, to complete the formation of the multi-layered metal wire structure as shown in FIG. 2, via holes 20 to expose the lower metal wire layers 12 are formed by selectively etching the second 16b and first 16a interlayer insulation films, the via holes 20 are filled with metal material, and then upper metal wire layers are formed.

As apparent from the above description, in the example semiconductor device having the multi-layered metal wire structure described herein, because air gaps are formed at the interlevel between the lower metal wire layers and the upper metal wire layers, sizes of air gaps can be significantly increased over the prior art where air gaps are formed between metal wires at the same layer. Accordingly, since a capacitance can be significantly reduced, an insulation characteristic of an interlayer insulation film can be improved.

In addition, since a parasitic capacitance can be significantly reduced while using existing interlayer insulation material as it is, a high speed operation device can be realized at an inexpensive process cost.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method of fabricating a semiconductor device, comprising:

forming a first interlayer insulation film above a lower insulation film on a top surface of a semiconductor substrate where an individual element including lower metal wire layers is formed;

forming a first mask film and a second mask film on the first interlayer insulation film sequentially;

forming a first etch mask to be used to form air gaps by selectively etching the second mask film;

depositing a third mask film on the first etch mask and the first mask film;

forming a second etch mask by etching the third mask film and exposed the first mask film, wherein the second etch mask is made from the third mask film remaining on side walls of the first etch mask and the first mask film remaining below the first etch mask and the third mask film;

removing the first etch mask and simultaneously forming open pores in the first interlayer insulation film by etching the first etch mask and exposed the first interlayer insulator film using the second etch mask;

forming air gaps comprising closed pores in the first interlayer film at an interlevel between upper metal wire layers and the lower metal wire layers by forming a second interlayer insulation film after removing the second etch mask; and forming via holes to expose the lower metal wire layers by selectively removing the first and second interlayer insulation films, filling metal material in the via holes, and forming the upper metal wire layers.

2. A method as defined in claim 1, wherein the first and second interlayer insulation layers are made from TEOS family material.

3. A method as defined in claim 1, wherein the first mask film have different etch rate from the second and third mask films.

4. A method as defined in claim 3, wherein the first mask film is made from an oxide film.

5. A method as defined in claim 3, wherein the first mask film is made from same material as the first interlayer insulator film.

6. A method as defined in claim 1, wherein the second and third mask films have a substantially similar etch rate.

7. A method as defined in claim 6, wherein the second and third mask films are made from a nitride film.

8. A method as defined in claim 1, wherein etching to form the second etch mask is performed by isotropic etching.

* * * * *